(12) United States Patent
Ko

(10) Patent No.: US 9,099,992 B2
(45) Date of Patent: Aug. 4, 2015

(54) SEMICONDUCTOR DEVICES

(71) Applicant: SK hynix Inc., Icheon-si Gyeonggi-do (KR)

(72) Inventor: Bok Rim Ko, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/079,758

(22) Filed: Nov. 14, 2013

(65) Prior Publication Data

US 2014/0354339 A1    Dec. 4, 2014

(30) Foreign Application Priority Data

May 29, 2013    (KR) .................. 10-2013-0061191

(51) Int. Cl.
*H03K 3/00* (2006.01)
*H03K 3/012* (2006.01)

(52) U.S. Cl.
CPC ...................... *H03K 3/012* (2013.01)

(58) Field of Classification Search
CPC ............... G06F 1/10; G06F 1/04; G06F 1/08; H03K 5/135; G11C 7/22
USPC .................................................. 327/291–296
See application file for complete search history.

(56) References Cited

U.S. PATENT DOCUMENTS

2013/0241812 A1*  9/2013  Fujikawa, Shinsuke ........ 345/84

FOREIGN PATENT DOCUMENTS

KR    1020070056445 A    6/2007
KR    1020100041200 A    4/2010

* cited by examiner

*Primary Examiner* — Lincoln Donovan
*Assistant Examiner* — Diana J Cheng
(74) *Attorney, Agent, or Firm* — William Park & Associates Ltd.

(57) ABSTRACT

The semiconductor device includes an internal clock generator, a shift signal generator and a first control signal generator. The internal clock generator generates a first internal clock signal and a second internal clock signal in response to an external clock signal. The shift signal generator shifts a clock enable signal in response to the first internal clock signal to generate first and second shift signals, and the shift signal generator shifts the clock enable signal in response to the second internal clock signal to generate third and fourth shift signals. The first control signal generator generates a first control signal in response to the first and third shift signals.

19 Claims, 9 Drawing Sheets

SEMICONDUCTOR DEVICES

CROSS-REFERENCE TO RELATED APPLICATION

The present application claims priority under 35 U.S.C 119(a) to Korean Application No. 10-2013-0061191, filed on May 29, 2013, in the Korean Intellectual Property Office, which is incorporated herein by reference in its entirety as set forth in full.

BACKGROUND

1. Technical Field

Embodiments relate to semiconductor devices and, more particularly, to semiconductor devices operated by internal clock signals.

2. Related Art

Semiconductor devices, for example, dynamic random access memory (DRAM) devices may be designed to operate at a high speed with low power consumption and large cell capacitance. Thus, most semiconductor devices may be designed to have a power-down mode that minimizes a driving current when data is not being accessed. In general, semiconductor devices may be released from the power-down mode if a clock enable signal is enabled and inputted even in the power-down mode.

The semiconductor devices may still communicate with external chip set devices using the clock enable signal even though the semiconductor devices are in the power-down mode. The clock enable signal may act as a reference signal that determines whether a clock signal outputted from the external chip set devices should be applied to internal circuits of the semiconductor devices. The semiconductor devices may transmit the clock signal to the internal circuits thereof only when the clock enable signal is activated. That is, the semiconductor devices typically do not transmit the clock signal to the internal circuits thereof when the clock enable signal is inactivated. The semiconductor devices may execute a data access operation when the clock signal is transmitted to the internal circuits of the semiconductor devices.

Meanwhile, each of the semiconductor devices may generate a plurality of internal clock signals having different phases to operate at a high speed and may input or output data using the plurality of internal clock signals. For example, if at least two internal clock signals are generated in each of the semiconductor devices and are used to receive or output data, the semiconductor devices may operate at a higher speed as compared with other semiconductor devices directly operated using an external clock signal. When a plurality of internal clock signals are used in each semiconductor device, it may be necessary to reset starting points of time and terminating points of time of a plurality of control operations including the power-down mode using the internal clock signals as reference signals.

SUMMARY

Various embodiments are directed to semiconductor devices operated by internal clock signals.

According to some embodiments, a semiconductor device includes an internal clock generator, a shift signal generator and a first control signal generator. The internal clock generator generates a first internal clock signal and a second internal clock signal in response to an external clock signal. The shift signal generator shifts a clock enable signal in response to the first internal clock signal to generate first and second shift signals, and the shift signal generator shifts the clock enable signal in response to the second internal clock signal to generate third and fourth shift signals. The first control signal generator generates a first control signal in response to the first and third shift signals.

According to further embodiments, a semiconductor device includes a shift signal generator and a control signal generator. The shift signal generator shifts a clock enable signal in response to a first internal clock signal to generate a first plurality shift signals, and the shift signal generator shifts the clock enable signal in response to a second internal clock signal to generate a second plurality shift signals. The control signal generator receives the first plurality of shift signals to generate a first control signal enabled in a power-down mode. Further, the control signal generator receives the first plurality of shift signals to generate a second control signal for controlling a command address buffer. Moreover, the control signal generator receives the second and fourth shift signals to generate a third control signal for controlling a clock buffer.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Example embodiments of the inventive concept will be described hereinafter with reference to the accompanying drawings. However, the example embodiments described herein are for illustrative purposes only and are not intended to limit the scope of the inventive concept.

Figure 1:
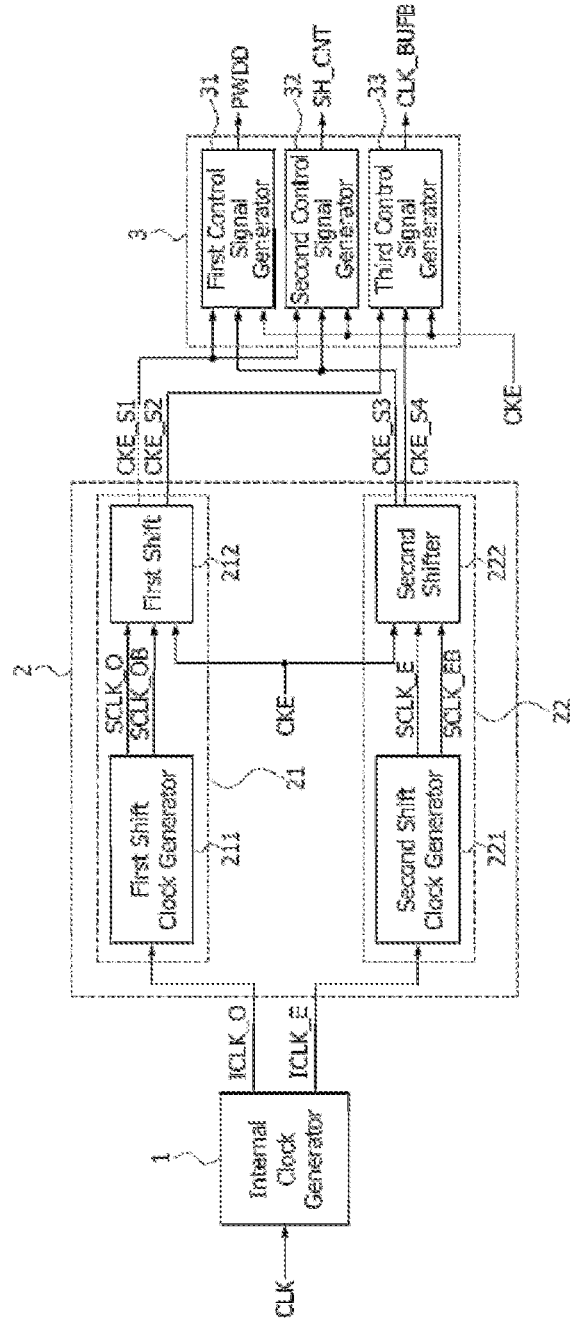
FIG. 1 is a block diagram illustrating a configuration of a semiconductor device according to some embodiments.

As illustrated in FIG. 1, a semiconductor device according to some embodiments may include an internal clock generator 1, a shift signal generator 2 and a control signal generator 3. The shift signal generator 2 may include a first shift signal generator 21 and a second shift signal generator 22. The first shift signal generator 21 may include a first shift clock generator 211 and a first shifter 212. The second shift signal generator 22 may include a second shift clock generator 221 and a second shifter 222. The control signal generator 3 may include a first control signal generator 31, a second control signal generator 32 and a third control signal generator 33.

The internal clock generator 1 may receive an external clock signal CLK to generate a first internal clock signal ICLK_O and a second internal clock signal ICLK_E. The first and second internal clock signals ICLK_O and ICLK_E may be toggled in synchronization with first edges or second edges of the external clock signal CLK. For example, the first and second internal clock signals ICLK_O and ICLK_E may be toggled in synchronization with the first edges of the external clock signal CLK. The first edges may be rising edges and the second edges may be falling edges. In some embodiments, the first internal clock signal ICLK_O may be toggled in synchronization with the rising edges of the external clock signal CLK, and the second internal clock signal ICLK_E may be toggled in synchronization with the rising edges of the external clock signal CLK to be a complementary signal (or an inverted signal) of the first internal clock signal ICLK_O. Each of the first and second internal clock signals ICLK_O and ICLK_E may be a 2-division signal having a cycle time which is twice that of the external clock signal CLK. The internal clock generator 1 may be realized using a divider. The first and second internal clock signals ICLK_O and ICLK_E may be generated to control data input/output (I/O) operations of the semiconductor device that operates at a high speed.

The first shift clock generator 211 may delay the first internal clock signal ICLK_O for a predetermined period and may buffer or inversely buffer the delayed first internal clock signal ICLK_O to generate a first shift clock signal SCLK_O and a first complementary shift clock signal SCLK_OB in response to the first internal clock signal ICLK_O. The first shifter 212 may shift a clock enable signal CKE in synchronization with the first shift clock signal SCLK_O and the first complementary shift clock signal SCLK_OB to generate a first shift signal CKE_S1 and a second shift signal CKE_S2. The first and second shift signals CKE_S1 and CKE_S2 may be set to have various enablement points of time according to the embodiments.

The second shift clock generator 221 may delay the second internal clock signal ICLK_E for a predetermined period and may buffer or inversely buffer the delayed second internal clock signal ICLK_E to generate a second shift clock signal SCLK_E and a second complementary shift clock signal SCLK_EB in response to the second internal clock signal ICLK_E. The second shifter 222 may shift the clock enable signal CKE in synchronization with the second shift clock signal SCLK_E and the second complementary shift clock signal SCLK_EB to generate a third shift signal CKE_S3 and a fourth shift signal CKE_S4. The third and fourth shift signals CKE_S3 and CKE_S4 may be set to have various enablement points of time according to the embodiments.

The first control signal generator 31 may receive the first and third shift signals CKE_S1 and CKE_S3 in response to the clock enable signal CKE to generate a first control signal PWDD in response to the first and third shift signals CKE_S1 and CKE_S3, where the first control signal PWDD is enabled in a power-down mode. The second control signal generator 32 may receive the first and third shift signals CKE_S1 and CKE_S3 in response to the clock enable signal CKE. The second control signal generator 32 may be configured to generate a second control signal SH_CNT in response to the first and third shift signals CKE_S1 and CKE_S3. The second control signal SH_CNT may be enabled to terminate a drive of a command address buffer 4 to which command signals CMD or address signals ADDR are inputted. The third control signal generator 33 may receive the second and fourth shift signals CKE_S2 and CKE_S4 in response to the clock enable signal CKE. The third control signal generator 33 may generate a third control signal CLK_BUFB in response to the second and fourth shift signals CKE_S2 and CKE_S4. The third control signal CLK_BUFB may be enabled to terminate a drive of a clock buffer 5 to which the external clock signal CLK is inputted.

Figure 2:
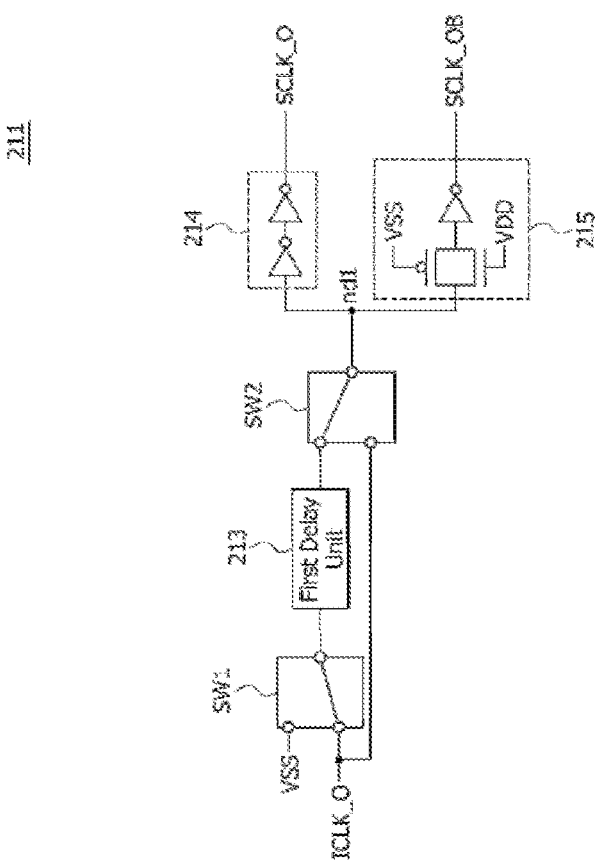
FIG. 2 is a circuit diagram illustrating an example of a first shift clock generator included in the semiconductor device of FIG. 1.

Referring to FIG. 2, the first shift clock generator 211 may include a first switch SW1, a first delay unit 213, a second switch SW2, a first buffer 214 and a first inversion buffer 215. The first switch SW1 may execute a switching operation such that a ground voltage VSS or the first internal clock signal ICLK_O is selectively transmitted to the first delay unit 213. The first delay unit 213 may delay an output signal of the first switch SW1 by a first delay time and the first switch SW1 may output the delayed output signal. The second switch SW2 may execute a switching operation such that the first internal clock signal ICLK_O or an output signal of the first delay unit 213 is selectively transmitted to a node ND1. The first buffer 214 may buffer a signal of the node ND1 to generate the first shift clock signal SCLK_O. The first inversion buffer 215 may inversely buffer the signal of the node ND1 to generate the first complementary shift clock signal SCLK_OB. The first buffer 214 may be realized using a couple of inverters which are cascaded. In such a case, the first inversion buffer 215 may be configured to include a single inverter and a single transfer gate which is connected to a ground terminal VSS and a power supply terminal VDD in order to have the same loading time as the first buffer 214.

As described above, the first internal clock signal ICLK_O may be delayed or not delayed according to set conditions of the first and second switches SW1 and SW2 included in the first shift clock generator 211. For example, when the first and second switches SW1 and SW2 are set such that the first internal clock signal ICLK_O is transmitted to the node ND1 through the first delay unit 213, the first shift clock generator 211 may delay the first internal clock signal ICLK_O by a first delay time and may buffer and inversely buffer the delayed signal of the first internal clock signal ICLK_O using the first buffer 214 and the first inversion buffer 215 to generate the first shift clock signal SCLK_O and the first complementary shift clock signal SCLK_OB. Alternatively, when the first and second switches SW1 and SW2 are set such that the first internal clock signal ICLK_O is directly transmitted to the node ND1, the first shift clock generator 211 may buffer and inversely buffer the first internal clock signal ICLK_O using the first buffer 214 and the first inversion buffer 215 to generate the first shift clock signal SCLK_O and the first complementary shift clock signal SCLK_OB.

Figure 3:
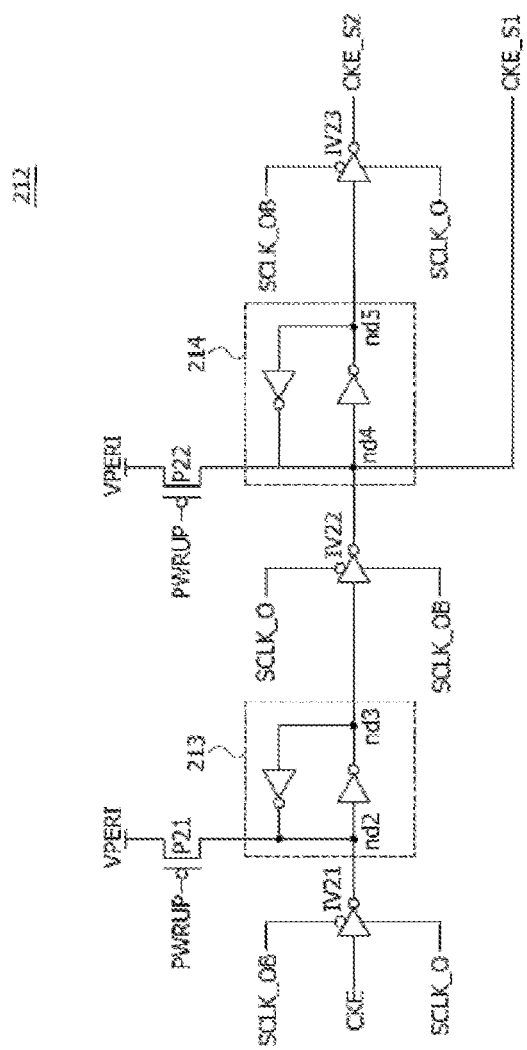
FIG. 3 is a circuit diagram illustrating an example of a first shifter included in the semiconductor device of FIG. 1.

Referring to FIG. 3, the first shifter 212 may include a first inverter IV21, a first latch unit 213, a first initialization element P21, a second inverter IV22, a second latch unit 214, a second initialization element P22 and a third inverter IV23. When the first shift clock signal SCLK_O has a logic "high" level and the first complementary shift clock signal SCLK_OB has a logic "low" level, the first inverter IV21 may inversely buffer the clock enable signal CKE and may transmit the inverted and buffered signal of the clock enable signal CKE to a node ND2. The first latch unit 213 may latch the signal on the node ND2 to output an inverted signal of the signal on the node ND2 through a node ND3. The first initialization element P21 may be turned on in response to a power-up signal PWRUP to initialize a level of the node ND2 to a peripheral voltage VPERI. The power-up signal PWRUP may be changed from a logic "high" level to a logic "low" level after a power-up period terminates. When the first shift clock signal SCLK_O has a logic "low" level and the first complementary shift clock signal SCLK_OB has a logic "high" level, the second inverter IV22 may inversely buffer the signal on the node ND3 and may output the inverted and buffered signal of the signal on the node ND3 as the first shift signal CKE_S1 through a node ND4. The second latch unit 214 may latch the first shift signal CKE_S1 signal on the node ND4 to output an inverted signal of the signal on the node ND4 through a node ND5. The second initialization element P22 may be turned on in response to the power-up signal PWRUP to initialize a level of the node ND4 to the peripheral voltage VPERI. When the first shift clock signal SCLK_O has a logic "high" level and the first complementary shift clock signal SCLK_OB has a logic "low" level, the third inverter IV23 may inversely buffer the signal on the node ND5 to output the inverted and buffered signal of the signal on the node ND5 as the second shift signal CKE_S2.

The first shifter 212 having the aforementioned configuration may generate the first shift signal CKE_S1 enabled to have a logic "high" level when a level of the first shift clock signal SCLK_O is changed from a logic "high" level into a logic "low" level and a level of the first complementary shift clock signal SCLK_OB is changed from a logic "low" level into a logic "high" level after the clock enable signal CKE is disabled to have a logic "low" level. Further, The first shifter 212 may generate the second shift signal CKE_S2 enabled to have a logic "high" level after the clock enable signal CKE is disabled to have a logic "low" level when a level of the first shift clock signal SCLK_O is changed from a logic "low" level into a logic "high" level and a level of the first complementary shift clock signal SCLK_OB is changed from a logic "high" level into a logic "low" level.

In contrast, the first shifter 212 may generate the first shift signal CKE_S1 disabled to have a logic "low" level when a level of the first shift clock signal SCLK_O is changed from a logic "high" level into a logic "low" level and a level of the first complementary shift clock signal SCLK_OB is changed from a logic "low" level into a logic "high" level after the clock enable signal CKE is enabled to have a logic "high" level. Further, The first shifter 212 may generate the second shift signal CKE_S2 disabled to have a logic "low" level after the clock enable signal CKE is enabled to have a logic "high" level when a level of the first shift clock signal SCLK_O is changed from a logic "low" level into a logic "high" level and a level of the first complementary shift clock signal SCLK_OB is changed from a logic "high" level into a logic "low" level.

The first shift signal CKE_S1 may be a signal that corresponds to the clock enable signal CKE is shifted to a first falling edge of the first shift clock signal SCLK_O after the clock enable signal CKE is disabled. The second shift signal CKE_S2 may be a signal that correspond to the first shift signal CKE_S1 shifted by a half cycle of the first shift clock signal SCLK_O.

Figure 4:
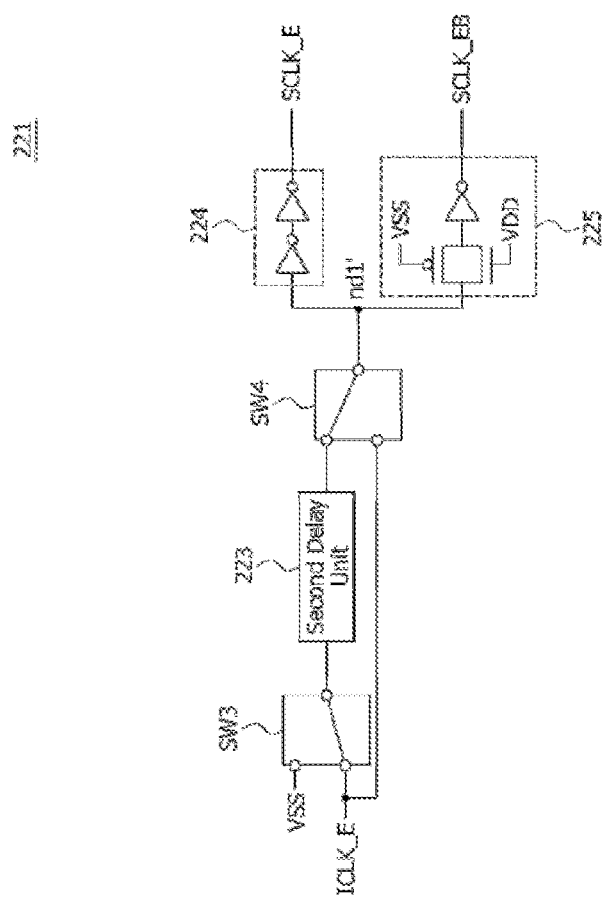
FIG. 4 is a circuit diagram illustrating an example of a second shift clock generator included in the semiconductor device of FIG. 1.

Referring to FIG. 4, the second shift clock generator 221 may include a third switch SW3, a second delay unit 223, a fourth switch SW4, a second buffer 224 and a second inversion buffer 225. The third switch SW3 may execute a switching operation such that the ground voltage VSS or the second internal clock signal ICLK_E is selectively transmitted to the second delay unit 223. The second delay unit 223 may delay an output signal of the third switch SW3 by a second delay time and may output the delayed signal of the output signal of the third switch SW3. The fourth switch SW4 may execute a switching operation such that the second internal clock signal ICLK_E or an output signal of the second delay unit 223 is selectively transmitted to a node ND1'. The second buffer 224 may buffer a signal of the node ND1' to generate the second shift clock signal SCLK_E. The second inversion buffer 225 may inversely buffer the signal of the node ND1' to generate the second complementary shift clock signal SCLK_EB. The second buffer 224 may be realized using two inverters which are cascaded. If the second buffer 224 includes two inverters, the second inversion buffer 225 may be configured to include a single inverter and a single transfer gate. The single transfer gate may be connected to the ground terminal VSS and the power supply terminal VDD. If the second inversion buffer 225 includes a single inverter and a single transfer gate, the second inversion buffer 225 may have the same loading time as the second buffer 224.

As described above, the second internal clock signal ICLK_E may be delayed or not delayed according to set conditions of the third and fourth switches SW3 and SW4. For example, when the third and fourth switches SW3 and SW4 are set such that the second internal clock signal ICLK_E is transmitted to the node ND1' through the second delay unit 223, the second shift clock generator 221 may delay the second internal clock signal ICLK_E by a second delay time and may buffer and inversely buffer the delayed signal of the first internal clock signal ICLK_O using the second buffer 224 and the second inversion buffer 225 to generate the second shift clock signal SCLK_E and the second complementary shift clock signal SCLK_EB. Alternatively, when the third and fourth switches SW3 and SW4 are set such that the second internal clock signal ICLK_E is directly transmitted to the node ND1' without passing through the second delay unit 223, the second shift clock generator 221 may buffer and inversely buffer the second internal clock signal ICLK_E using the second buffer 224 and the second inversion buffer 225 to generate the second shift clock signal SCLK_E and the second complementary shift clock signal SCLK_EB.

Figure 5:
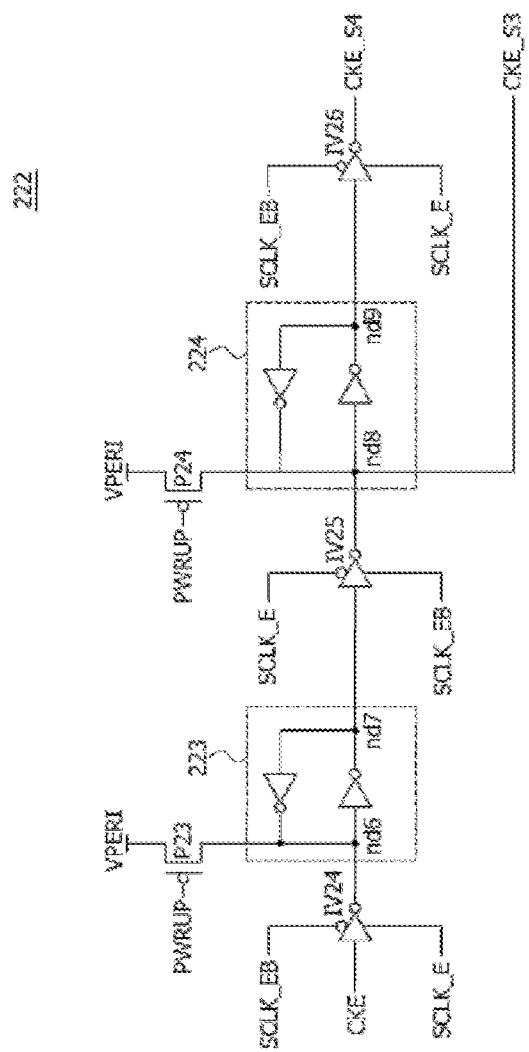
FIG. 5 is a circuit diagram illustrating an example of a second shifter included in the semiconductor device of FIG. 1.

Referring to FIG. 5, the second shifter 222 may include a fourth inverter IV24, a third latch unit 223, a third initialization element P23, a fifth inverter IV25, a fourth latch unit 224, a fourth initialization element P24 and a sixth inverter IV26. When the second shift clock signal SCLK_E has a logic "high" level and the second complementary shift clock signal SCLK_EB has a logic "low" level, the fourth inverter IV24 may inversely buffer the clock enable signal CKE and may transmit the inverted and buffered signal of the clock enable signal CKE to a node ND6. The third latch unit 223 may latch the signal on the node ND6 to output an inverted signal of the signal on the node ND6 through a node ND7. The third initialization element P23 may be turned on in response to the power-up signal PWRUP to initialize a level of the node ND6 to the peripheral voltage VPERI. When the second shift clock signal SCLK_E has a logic "low" level and the second complementary shift clock signal SCLK_EB has a logic "high" level, the fifth inverter IV25 may inversely buffer the signal on the node ND7 and may output the inverted and buffered signal of the signal on the node ND7 as the third shift signal CKE_S3 through a node ND8. The fourth latch unit 224 may latch the third shift signal CKE_S3 on the node ND8 to output an inverted signal of the signal on the node ND8 through a node ND9. The fourth initialization element P24 may be turned on in response to the power-up signal PWRUP to initialize a level of the node ND8 to the peripheral voltage VPERI. When the second shift clock signal SCLK_E has a logic "high" level and the second complementary shift clock signal SCLK_EB has a logic "low" level, the sixth inverter IV26 may inversely buffer the signal on the node ND9 to output the inverted and buffered signal of the signal on the node ND9 as the fourth shift signal CKE_S4.

The second shifter 222 having the aforementioned configuration may generate the third shift signal CKE_S3 enabled to have a logic "high" level after the clock enable signal CKE is disabled to have a logic "low" level when a level of the second shift clock signal SCLK_E is changed from a logic "high" level into a logic "low" level and a level of the second complementary shift clock signal SCLK_EB is changed from a logic "low" level into a logic "high" level. Further, The second shifter 222 may generate the fourth shift signal CKE_S4 enabled to have a logic "high" level after the clock enable signal CKE is disabled to have a logic "low" level when a level of the second shift clock signal SCLK_E is changed from a logic "low" level into a logic "high" level and a level of the second complementary shift clock signal SCLK_EB is changed from a logic "high" level into a logic "low" level.

In contrast, the second shifter 222 may generate the third shift signal CKE_S3 disabled to have a logic "low" level after the clock enable signal CKE is enabled to have a logic "high" level when a level of the second shift clock signal SCLK_E is changed from a logic "high" level into a logic "low" level and a level of the second complementary shift clock signal SCLK_EB is changed from a logic "low" level into a logic "high" level. Further, The second shifter 222 may generate the fourth shift signal CKE_S4 disabled to have a logic "low" level after the clock enable signal CKE is enabled to have a logic "high" level when a level of the second shift clock signal SCLK_E is changed from a logic "low" level into a logic "high" level and a level of the second complementary shift clock signal SCLK_EB is changed from a logic "high" level into a logic "low" level.

The third shift signal CKE_S3 may be a signal that corresponds to the clock enable signal CKE shifted to a first falling edge of the second shift clock signal SCLK_E after the clock enable signal CKE is disabled. The fourth shift signal CKE_S4 may be a signal that corresponds to the third shift signal CKE_S3 shifted by a half cycle of the second shift clock signal SCLK_E.

Figure 6:
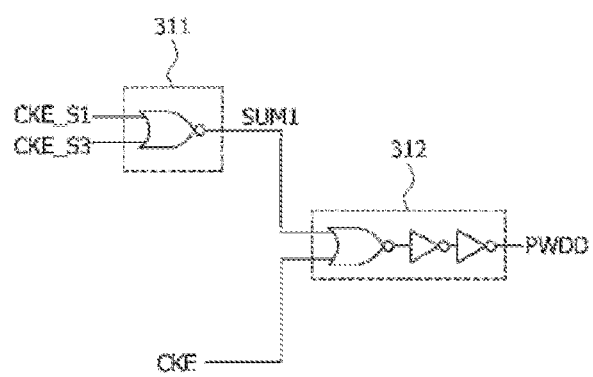
FIG. 6 is a circuit diagram illustrating an example of a first control signal generator included in the semiconductor device of FIG. 1.

Referring to FIG. 6, the first control signal generator 31 may include a first synthetic signal generator 311 and a first output unit 312. The first synthetic signal generator 311 may generate a first synthetic signal SUM1 having a logic "low" level when at least one of the first and third shift signals CKE_S1 and CKE_S3 is enabled to have a logic "high" level. The first output unit 312 may generate the first control signal PWDD enabled to have a logic "high" level if the first synthetic signal SUM1 having a logic "low" level is inputted while the clock enable signal CKE is disabled to have a logic "low" level. The first output unit 312 may generate the first control signal PWDD disabled to have a logic "low" level regardless of a logic level of the first synthetic signal SUM1 while the clock enable signal CKE is enabled to have a logic "high" level. The first control signal PWDD may be enabled to have a logic "high" level in the power-down mode.

The first control signal generator 31 having the aforementioned configuration may generate the first control signal PWDD enabled to have a logic "high" level if at least one of the first and third shift signals CKE_S1 and CKE_S3 is enabled to have a logic "high" level while the clock enable signal CKE is disabled to have a logic "low" level. Further, the first control signal generator 31 may generate the first control signal PWDD disabled to have a logic "low" level if the clock enable signal CKE is enabled to have a logic "high" level.

Figure 7:
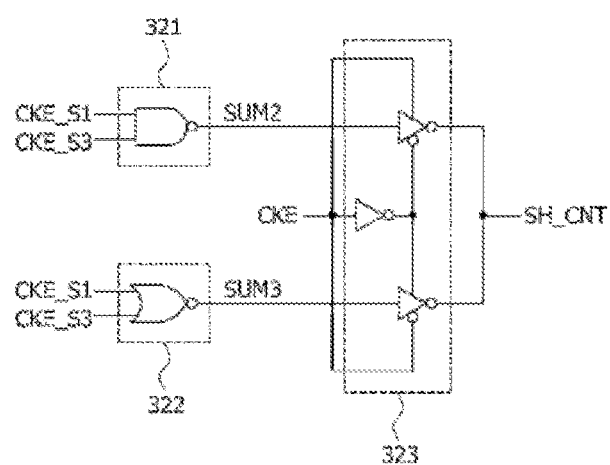
FIG. 7 is a circuit diagram illustrating an example of a second control signal generator included in the semiconductor device of FIG. 1.

Referring to FIG. 7, the second control signal generator 32 may include a second synthetic signal generator 321, a third synthetic signal generator 322 and a second output unit 323. The second synthetic signal generator 321 may generate a second synthetic signal SUM2 having a logic "high" level when at least one of the first and third shift signals CKE_S1 and CKE_S3 is disabled to have a logic "low" level. The third synthetic signal generator 322 may generate a third synthetic signal SUM3 having a logic "low" level when at least one of the first and third shift signals CKE_S1 and CKE_S3 is enabled to have a logic "high" level. The second output unit 323 may generate the second control signal SH_CNT enabled to have a logic "high" level if the third synthetic signal SUM3 having a logic "low" level is inputted while the clock enable signal CKE is disabled to have a logic "low" level. The second output unit 323 may generate the second control signal SH_CNT disabled to have a logic "low" level if the second synthetic signal SUM2 having a logic "high" level is inputted while the clock enable signal CKE is enabled to have a logic "high" level. The second control signal SH_CNT may be a signal that is enabled to terminate a drive of the command address buffer 4 to which command signals CMD or address signals ADDR are inputted.

The second control signal generator 32 having the aforementioned configuration may generate the second control signal SH_CNT enabled to have a logic "high" level while the clock enable signal CKE is disabled to have a logic "low" level, if at least one of the first and third shift signals CKE_S1 and CKE_S3 is enabled to have a logic "high" level. Further, the second control signal generator 32 may generate the second control signal SH_CNT disabled to have a logic "low" level while the clock enable signal CKE is enabled to have a logic "high" level, if at least one of the first and third shift signals CKE_S1 and CKE_S3 is disabled to have a logic "low" level.

Figure 8:
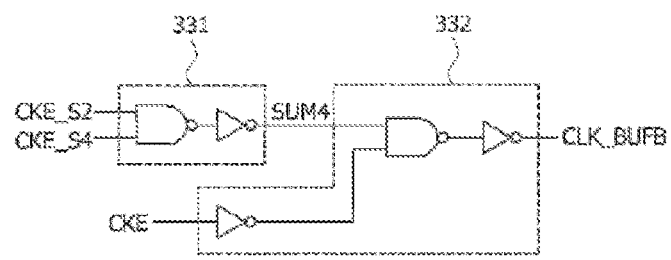
FIG. 8 is a circuit diagram illustrating an example of a third control signal generator included in the semiconductor device of FIG. 1.

Referring to FIG. 8, the third control signal generator 33 may include a fourth synthetic signal generator 331 and a third output unit 332. The fourth synthetic signal generator 331 may generate a fourth synthetic signal SUM4 having a logic "high" level when both the second and fourth shift signals CKE_S2 and CKE_S4 are enabled to have a logic "high" level. The third output unit 332 may generate the third control signal CLK_BUFB enabled to have a logic "high" level if the fourth synthetic signal SUM4 having a logic "high" level is inputted while the clock enable signal CKE is disabled to have a logic "low" level. The third output unit 332 may generate the third control signal CLK_BUFB disabled to have a logic "low" level regardless of a logic level of the fourth synthetic signal SUM4 while the clock enable signal CKE is enabled to have a logic "high" level. The third control signal CLK_BUFB may be a signal that is enabled to terminate a drive of the clock buffer 5 to which the external clock CLK is inputted.

The third control signal generator 33 having the aforementioned configuration may generate the third control signal CLK_BUFB enabled to have a logic "high" level if both the second and fourth shift signals CKE_S2 and CKE_S4 are enabled to have a logic "high" level while the clock enable signal CKE is disabled to have a logic "low" level. Further, the third control signal generator 33 may generate the third control signal CLK_BUFB disabled to have a logic "low" level when the clock enable signal CKE is enabled to have a logic "high" level.

Hereinafter, an operation of the semiconductor device as set forth above will be described with reference to FIGS. 1 and 9.

Figure 9:
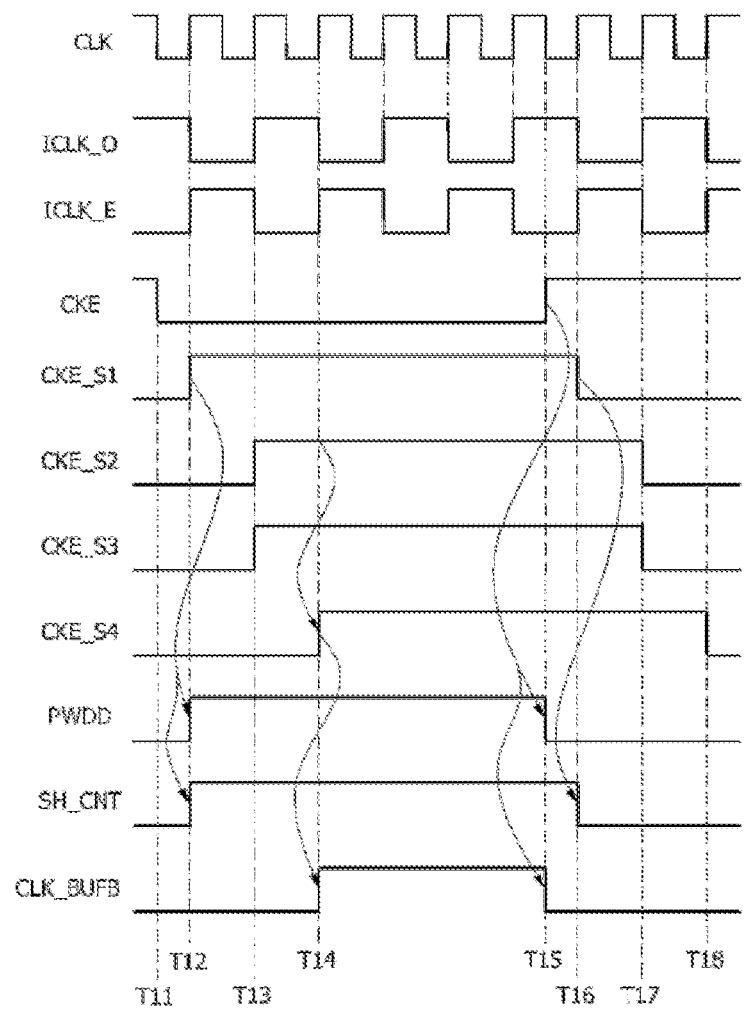
FIG. 9 is a timing diagram illustrating an operation of the semiconductor device of FIG. 1.

Referring to FIGS. 1 and 9, the internal clock generator 1 may receive the external clock signal CLK to generate the first and second internal clock signals ICLK_O and ICLK_E which are toggled in synchronization with the rising edges of the external clock CLK. The second internal clock signal ICLK_E may be toggled in synchronization with the rising edges of the external clock signal CLK to be a complementary signal (or an inverted signal) of the first internal clock signal ICLK_O.

Subsequently, the shift signal generator 2 may shift the clock enable signal CKE in synchronization with the first and second internal clock signals ICLK_O and ICLK_E to generate the first to fourth shift signals CKE_S1, CKE_S2, CKE_S3 and CKE_S4. The first shift signal CKE_S1 may be enabled to have a logic "high" level at a point of time "T12" that a first falling edge of the first internal clock signal ICLK_O occurs after a point of time "T11" that the clock enable signal CKE is disabled to have a logic "low" level. The second shift signal CKE_S2 may be enabled to have a logic "high" level at a point of time "T13" that a first rising edge of the first internal clock signal ICLK_O occurs after the point of time "T12" that the first shift signal CKE_S1 is enabled to have a logic "high" level. The third shift signal CKE_S3 may be enabled to have a logic "high" level at the point of time "T13" that a first falling edge of the second internal clock signal ICLK_E occurs after the point of time "T11" that the clock enable signal CKE is disabled to have a logic "low" level. Thus, the third shift signal CKE_S3 may be enabled a single external clock CLK cycle after the first shift signal CKE_S1 is enabled. The fourth shift signal CKE_S4 may be enabled to have a logic "high" level at a point of time "T14" that a first rising edge of the second internal clock signal ICLK_E occurs after the point of time "T13" that the third shift signal CKE_S3 is enabled to have a logic "high" level. Thus, the fourth shift signal CKE_S4 may be enabled a single external clock CLK cycle after the first shift signal CKE_S1 is enabled.

The first shift signal CKE_S1 may be disabled to have a logic "low" level at a point of time "T16" that a first falling edge of the first internal clock signal ICLK_O occurs after a point of time "T15" that the clock enable signal CKE is enabled to have a logic "high" level. The second shift signal CKE_S2 may be disabled to have a logic "low" level at a point of time "T17" that a first rising edge of the first internal clock signal ICLK_O occurs after the point of time "T16" that the first shift signal CKE_S1 is disabled to have a logic "low" level. The third shift signal CKE_S3 may be disabled to have a logic "low" level at the point of time "T17" that a first falling edge of the second internal clock signal ICLK_E occurs after the point of time "T15" that the clock enable signal CKE is enabled to have a logic "high" level. The fourth shift signal CKE_S4 may be disabled to have a logic "low" level at a point of time "T18" that a first rising edge of the second internal clock signal ICLK_E occurs after the point of time "T17" that the third shift signal CKE_S3 is disabled to have a logic "low" level.

Subsequently, the control signal generator 3 may generate the first control signal PWDD, the second control signal SH_CNT and the third control signal CLK_BUFB in response to the clock enable signal CKE, the first shift signal CKE_S1, the second shift signal CKE_S2, the third shift signal CKE_S3 and the fourth shift signal CKE_S4. In more detail, the control signal generator 3 may generate the first control signal PWDD enabled to have a logic "high" level if at least one of the first and third shift signals CKE_S1 and CKE_S3 is enabled to have a logic "high" level while the clock enable signal CKE is disabled to have a logic "low" level. The control signal generator 3 may generate the first control signal PWDD disabled to have a logic "low" level if the clock enable signal CKE is enabled to have a logic "high" level.

Further, the control signal generator 3 may generate the second control signal SH_CNT enabled to have a logic "high" level if at least one of the first and third shift signals CKE_S1 and CKE_S3 is enabled to have a logic "high" level while the clock enable signal CKE is disabled to have a logic "low" level. The control signal generator 3 may generate the second control signal SH_CNT disabled to have a logic "low" level if at least one of the first and third shift signals CKE_S1 and CKE_S3 is disabled to have a logic "low" level while the clock enable signal CKE is enabled to have a logic "high" level.

Moreover, the control signal generator 3 may generate the third control signal CLK_BUFB enabled to have a logic "high" level if both the second and fourth shift signals CKE_S2 and CKE_S4 are enabled to have a logic "high" level while the clock enable signal CKE is disabled to have a logic "low" level. The control signal generator 3 may generate the third control signal CLK_BUFB disabled to have a logic "low" level when the clock enable signal CKE is enabled to have a logic "high" level.

As described above, the semiconductor device according to the embodiments may set the enablement points of time of the first to third control signals PWDD, SH_CNT and CLK_BUFB in synchronization with the first and second internal clock signals ICLK_O and ICLK_E, where the internal clock signals ICLK_O and ICLK_E are generated to receive or output the data. That is, the first and second control signals PWDD and SH_CNT may be enabled at a first falling edge of the first internal clock signal ICLK_O or at a first rising edge of the second internal clock signal ICLK_E after the clock enable signal CKE is disabled to have a logic "low" level. Further, the third control signal CLK_BUFB may be enabled at a second falling edge of the first internal clock signal ICLK_O or at a second rising edge of the second internal clock signal ICLK_E after the clock enable signal CKE is disabled to have a logic "low" level. If the first to third control signals PWDD, SH_CNT and CLK_BUFB are set to be enabled in synchronization with the first and second internal clock signals ICLK_O and ICLK_E, the enablement points of time of the first to third control signals PWDD, SH_CNT and CLK_BUFB may be variously set according to the embodiments. As such, the enablement points of time of the first to third control signals PWDD, SH_CNT and CLK_BUFB may be set in synchronization with the first and second internal clock signals ICLK_O and ICLK_E. Thus, the semiconductor device according to the embodiments may prevent malfunctions in which a power-down mode, an operation of a command address buffer and an operation of a clock buffer terminate regardless of the first and second internal clock signals ICLK_O and ICLK_E.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor device comprising:
   an internal clock generator configured to generate a first internal clock signal and a second internal clock signal in response to an external clock signal;
   a shift signal generator configured to shift a clock enable signal in response to the first internal clock signal to generate first and second shift signals and configured to shift the clock enable signal in response to the second internal clock signal to generate third and fourth shift signals; and a first control signal generator configured to generate a first control signal in response to the first and third shift signals, wherein the first control signal is enabled in a power-down mode, and the power-down mode is entered when the clock enable signal is inactivated to terminate transmitting a clock signal to an internal circuit.

2. The semiconductor device of claim 1:
wherein the first and second internal clock signals are toggled in synchronization with first edges or second edges of the external clock signal; and
wherein the second internal clock signal is toggled to be a complementary signal of the first internal clock signal.

3. The semiconductor device of claim 2, wherein a cycle time of the first and second internal clock signals is twice that of the external clock signal.

4. The semiconductor device of claim 1, wherein the second shift signal is enabled at a point of time that a single cycle time of the external clock signal elapses after the first shift signal is enabled.

5. The semiconductor device of claim 4, wherein the first control signal is enabled if at least one of the first and third shift signals is enabled while the clock enable signal is disabled.

6. The semiconductor device of claim 5, wherein the first control signal is disabled if the clock enable signal is enabled.

7. The semiconductor device of claim 1, wherein the shift signal generator includes:
a first shift signal generator configured to generate a first shift clock signal and a first complementary shift clock signal in response to the first internal clock signal and configured to shift the clock enable signal in synchronization with the first shift clock signal and the first complementary shift clock signal to generate the first and second shift signals; and
a second shift signal generator configured to generate a second shift clock signal and a second complementary shift clock signal in response to the second internal clock signal and configured to shift the clock enable signal in synchronization with the second shift clock signal and the second complementary shift clock signal to generate the third and fourth shift signals.

8. The semiconductor device of claim 7, wherein the first shift signal generator includes:
a first shift clock generator configured to delay and buffer the first internal clock signal for a predetermined period to generate the first shift clock signal and the first complementary shift clock signal; and
a first shifter configured to shift the clock enable signal in synchronization with the first shift clock signal and the first complementary shift clock signal to generate the first and second shift signals.

9. The semiconductor device of claim 7, wherein the second shift signal generator includes:
a second shift clock generator configured to delay and buffer the second internal clock signal for a predetermined period to generate the second shift clock signal and the second complementary shift clock signal; and
a second shifter configured to shift the clock enable signal in synchronization with the second shift clock signal and the second complementary shift clock signal to generate the third and fourth shift signals.

10. The semiconductor device of claim 1, further comprising a second control signal generator configured to generate a second control signal in response to the first and third shift signals,
wherein the second control signal is enabled if at least one of the first and third shift signals is enabled while the clock enable signal is disabled, and the second control signal is disabled if at least one of the first and third shift signals is disabled while the clock enable signal is enabled.

11. The semiconductor device of claim 10, wherein the second control signal is enabled to terminate a drive of a buffer to which command signals or address signals are inputted.

12. The semiconductor device of claim 1, further comprising a third control signal generator configured to generate a third control signal in response to the second and fourth shift signals,
wherein the third control signal is enabled if both the second and fourth shift signals are enabled while the clock enable signal is disabled, and the third control signal is disabled when the clock enable signal is enabled.

13. The semiconductor device of claim 12, wherein the third control signal is enabled to terminate a drive of a buffer to which the external clock signal is inputted.

14. The semiconductor device of claim 12, wherein the third shift signal is enabled at a point of time that a single cycle time of the external clock signal elapses after the first shift signal is enabled.

15. The semiconductor device of claim 14, wherein the fourth shift signal is enabled at a point of time that a single cycle time of the external clock signal elapses after the third shift signal is enabled.

16. A semiconductor device comprising:
a shift signal generator configured to shift a clock enable signal in response to a first internal clock signal to generate a first plurality of shift signals and configured to shift the clock enable signal in response to a second internal clock signal to generate a second plurality of shift signals; and
a control signal generator configured to receive the first plurality of signals to generate a first control signal enabled in a power-down mode, configured to receive the first plurality of shift signals to generate a second control signal for controlling a command address buffer, and configured to receive the second plurality of shift signals to generate a third control signal for controlling a clock buffer, wherein the power-down mode is entered when the clock enable signal is inactivated to terminate transmitting a clock signal to an internal circuit.

17. The semiconductor device of claim 16, wherein:
the first plurality of shift signals includes a first shift signal and a third shift signal;
the second plurality of shift signals includes a second shift signal and a fourth shift signal, and
the first control signal is enabled if at least one of the first and third shift signals is enabled while the clock enable signal is disabled, and the first control signal is disabled if the clock enable signal is enabled.

18. The semiconductor device of claim 17, the second control signal is enabled if at least one of the first and third shift signals is enabled while the clock enable signal is disabled, and the second control signal is disabled if at least one of the first and third shift signals is disabled while the clock enable signal is enabled.

19. The semiconductor device of claim 18, wherein the third control signal is enabled if both the second and fourth shift signals are enabled while the clock enable signal is disabled, and the third control signal is disabled when the clock enable signal is enabled.

* * * * *